US008320184B2

United States Patent
Yang et al.

(10) Patent No.: US 8,320,184 B2
(45) Date of Patent: Nov. 27, 2012

(54) METHOD OF PROGRAMMING NONVOLATILE SEMICONDUCTOR MEMORY DEVICE

(75) Inventors: Seung-Jin Yang, Seoul (KR); Yong-Tae Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 168 days.

(21) Appl. No.: 12/961,133

(22) Filed: Dec. 6, 2010

(65) Prior Publication Data
US 2011/0182117 A1 Jul. 28, 2011

(30) Foreign Application Priority Data
Jan. 22, 2010 (KR) ........................ 10-2010-0006019

(51) Int. Cl.
*G11C 16/04* (2006.01)
(52) U.S. Cl. .............................. 365/185.18; 365/185.17
(58) Field of Classification Search ............. 365/185.18, 365/185.17, 185.28
See application file for complete search history.

(56) References Cited

U.S. PATENT DOCUMENTS

| 7,180,789 B2 | 2/2007 | Umezawa | |
|---|---|---|---|
| 2002/0118569 A1 * | 8/2002 | Jeong et al. | 365/185.18 |
| 2008/0183951 A1 * | 7/2008 | Lee et al. | 711/103 |
| 2009/0273978 A1 * | 11/2009 | Fukuda | 365/185.17 |

FOREIGN PATENT DOCUMENTS

| JP | 11-086570 | 3/1999 |
|---|---|---|
| KR | 1020020054511 | 7/2002 |
| KR | 1020020056210 | 7/2002 |

* cited by examiner

*Primary Examiner* — Vu Le
(74) *Attorney, Agent, or Firm* — F. Chau & Associates, LLC

(57) ABSTRACT

A method of programming a nonvolatile semiconductor memory device using a negative bias voltage. The method includes turning ON the string selection transistors connected to selected bit lines and turning OFF the string selection transistors connected to unselected bit lines in the same memory block, in a program mode. This can be achieved by applying a negative bias voltage to a bulk substrate and applying a voltage having a voltage level higher than the threshold voltage of string selection transistors connected to selected bit lines and lower than the threshold voltage of string selection transistors connected to unselected bit lines. The method may reduce programming disturbance between a selected cell string and an unselected cell string.

18 Claims, 16 Drawing Sheets

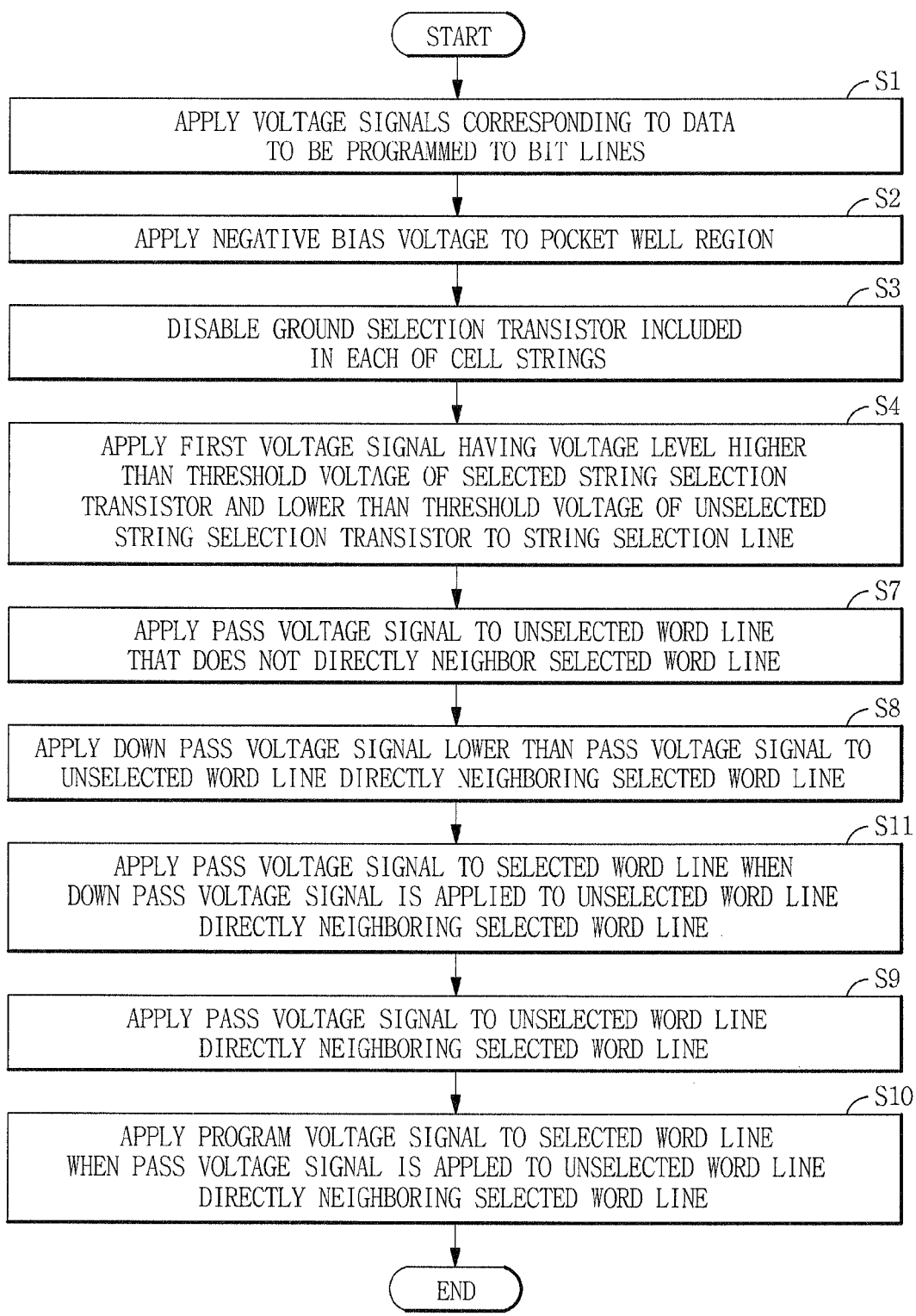

METHOD OF PROGRAMMING NONVOLATILE SEMICONDUCTOR MEMORY DEVICE

CROSS-REFERENCE TO RELATED APPLICATION

This application claims priority, under 35 U.S.C. §119, of Korean Patent Application No. 10-2010-0006019 filed on Jan. 22, 2010, which is hereby incorporated by reference in its entirety.

BACKGROUND

1. Field

The inventive concept relates to a method of programming a nonvolatile memory device and, more particularly, to a method of programming a NAND-type semiconductor flash memory device using a negative bias voltage.

2. Description of Related Art

Semiconductor memory devices may be largely classified into volatile memory devices and nonvolatile memory devices. A volatile memory device may store data as the logic state of a bistable flip-flop or as the charge stored in a capacitor. The volatile semiconductor memory device may only store or read data while power is supplied and will lose the stored data when the power is interrupted. The nonvolatile semiconductor memory device may be used to store programs and data in a wide range of applications, such as computers and communication devices.

A nonvolatile semiconductor memory device, such as an electrically erasable programmable read-only-memory (EEPROM), stores data even after power is interrupted. Since an EEPROM is electrically erasable and programmable, the EEPROM has been widely used as a system programming device or auxiliary memory device that needs to be continuously updated. A NAND-type flash memory device is generally more highly integrated (miniaturized) than a NOR-type flash memory device.

The NAND-type flash memory device includes a memory cell array to store data, and the memory cell array includes a plurality of cell strings (also called NAND strings). Each memory cell of the NAND-type flash memory device may perform erase and program operations using a Fowler-Nordheim (F-N) tunneling current.

In the program mode (the memory cell programming mode), a conventional NAND-type flash memory device may suffer from disturbance between a cell string coupled to a selected bit line and a cell string coupled to an unselected bit line.

SUMMARY

An aspect of the inventive concept provides a method of programming a nonvolatile semiconductor memory device, which may reduce programming interference between a selected cell string and an unselected cell string in a program mode by turning ON the string selection transistors connected to selected bit lines and turning OFF the string selection transistors connected to unselected bit lines in the same memory block.

In accordance with an aspect of the inventive concept, a method of programming a nonvolatile semiconductor memory device having a NAND-type memory cell array disposed in a pocket well includes: applying a negative bias voltage to the pocket well; and applying a first voltage to string selection transistors. The first voltage is higher than the threshold voltage of a string selection transistor of a selected string connected to a selected bit line and lower than the threshold voltage of a string selection transistor of an unselected string connected to an unselected bit line.

A negative voltage may be applied to the selected bit line, and a program inhibition voltage may be applied to the unselected bit line.

The program inhibition voltage may be higher than 0 V.

A voltage having the same voltage level as the negative bias voltage applied to the pocket well may be applied to the selected bit line.

In accordance with another aspect of the inventive concept, a method of programming a nonvolatile semiconductor memory device includes: generating a first voltage having a voltage level higher than the threshold voltage of a selected string selection transistor and lower than the threshold voltage of an unselected string selection transistor; applying the first voltage to a first memory block formed in a pocket well in a program mode; and applying a negative voltage having the same voltage level as a bias voltage of the pocket well to a second memory block formed in the pocket well in the program mode.

A bit line of the second memory block may share a metal line with the first memory block and have a contact and string selection transistors separately from the first memory block.

The first voltage may be applied to string selection transistors included in the first memory block, and the second voltage may be applied to string selection transistors included in the second memory block.

The string selection transistors included in the first memory block may be coupled to a first string selection line, and string selection transistors included in the second memory block may be coupled to a second string selection line electrically disconnected from the first string selection line.

In accordance with still another aspect of the inventive concept, a method of programming a nonvolatile semiconductor memory device having a NAND-type array formed in a pocket well includes: applying voltages corresponding to data to be programmed to bit lines; applying a negative bias voltage to the pocket well; disabling a ground selection transistor included in each of cell strings; and applying a first voltage to string selection transistors. The first voltage is higher than the threshold voltage of a string selection transistor of a selected string connected to a selected bit line and lower than the threshold voltage of a string selection transistor of an unselected string connected to an unselected bit line.

The exemplary embodiments of the present inventive concept provide structural and functional descriptions of the present inventive concept, but the inventive concept should not be construed as limited to the exemplary embodiments set forth herein. Thus, it will be clearly understood by those skilled in the art that the exemplary embodiments of the present inventive concept may be embodied in different forms and include all variations, equivalents, and substitutes that can realize the spirit of the present inventive concept.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise.

Unless expressly defined in a specific order herein, respective steps described in the present inventive concept may be performed otherwise. Thus, the respective steps may be performed in a specified order, substantially at the same time, or in reverse order.

Hereinafter, a method of programming a nonvolatile semiconductor memory device according to embodiments of the inventive concept will be described with reference to the appended drawings.

BRIEF DESCRIPTION OF THE DRAWINGS

The foregoing and other features of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings:

FIG. 17 is a flowchart illustrating a method of programming a NAND-type flash memory device according to other embodiments of the inventive concept.

DETAILED DESCRIPTION OF THE EMBODIMENTS

Figure 1:
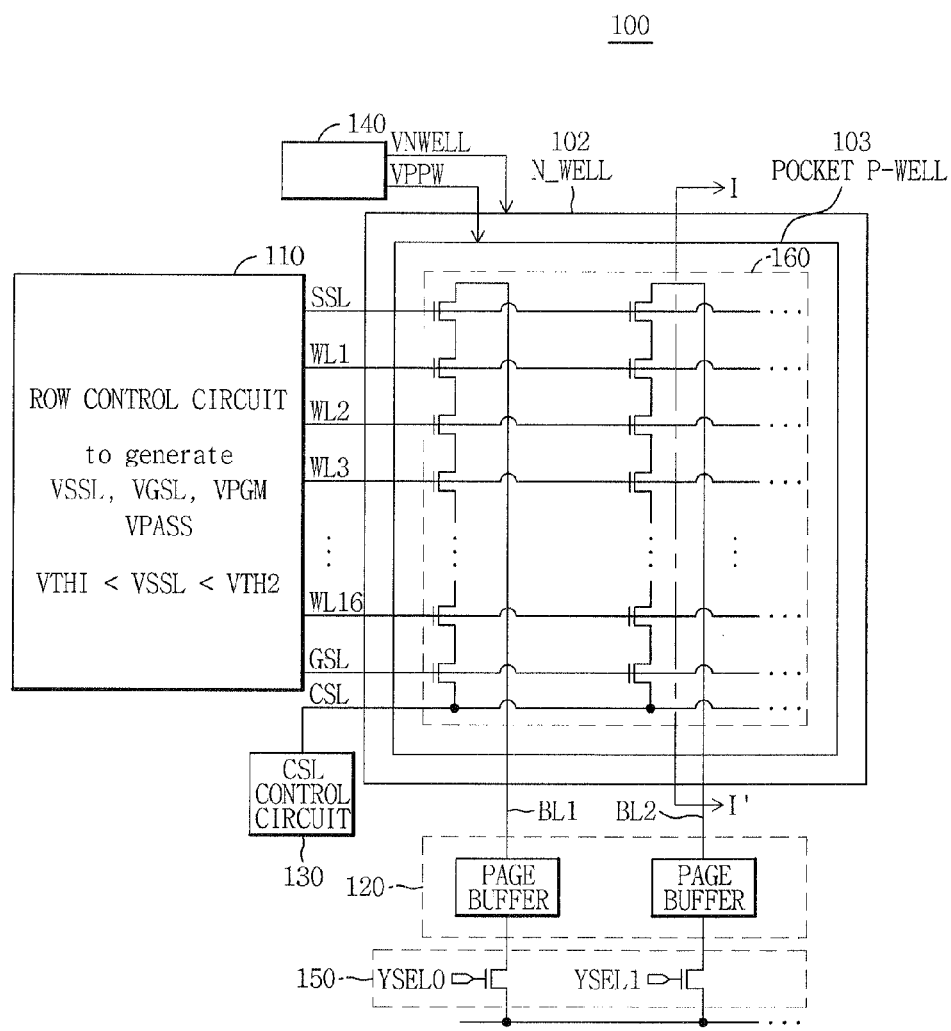
FIG. 1 is a block diagram of a NAND-type flash memory device according to an exemplary embodiments of the inventive concept.

FIG. 1 is a block diagram of a NAND-type flash memory device according to an exemplary embodiment of the inventive concept.

Referring to FIG. 1, a NAND-type flash memory device 100 includes a row control circuit 110, a page buffer circuit 120, a common source line control circuit 130, a well bias circuit 140, a column gate circuit 150, and a memory cell array 160.

The memory cell array 160 may be formed in a pocket p-well region (POCKET P-WELL 103), which may be formed in a deeper well (N-WELL 102) formed in a bulk substrate. When the deep well has n-type conductivity, the pocket p-well may be formed to have p-type conductivity. Alternatively, the memory cell array 160 may be directly formed in the bulk substrate without the pocket/well structure.

The row control circuit 110 may generate a program voltage VPGM, a pass voltage VPASS, and a first voltage VSSL. The first voltage VSSL (a string selection line voltage) may have a voltage level higher than the threshold voltage VTH1 of a selected string selection transistor and lower than the threshold voltage VTH2 of an unselected string selection transistor. The row control circuit 110 controls electric potentials (voltages) of the word lines WL1 to WL16, of a string selection line SSL, and of a ground selection line GSL.

In the memory cell array 160, the word lines WL1 to WL16, the string selection line SSL, the ground selection line GSL, and a common source line CSL may be arranged side by side in a row direction, and bit lines BL1 and BL2 may be arranged in a direction perpendicular to the word lines WL1 to WL16.

In FIG. 1, the first voltage VSSL denotes a string selection line (SSL) control voltage, and the voltage VGSL denotes a ground selection line (GSL) control voltage.

The page buffer circuit 120 includes a page buffer corresponding to each of the respective bit lines BL1 and BL2, and each of the page buffers may include a sense amplifier S/A (not shown). In a read mode, each of the page buffers functions to sense data from a selected memory cell and transmits the sensed data through the column gate circuit 150 to an input/output (I/O) circuit (not shown). In a program mode, each of the page buffers temporarily stores the data received through the I/O circuit and the column gate circuit 150. Thus, each of the page buffers function as both a data sensor and a latch. The column gate circuit 150 electrically connects or disconnects the page buffer circuit 120 to or from the I/O circuit in response to column selection signals (e.g., YSEL0 and YSEL1).

The common source line control circuit 130 controls the electric potential of the common source line CSL while in the program mode. The well bias circuit 140 generates the pocket p-well bias voltage VPPW, transmits the pocket p-well bias voltage VPPW to the pocket p-well region 103, and generates an n-well bias voltage VNWELL, and transmits the n-well bias voltage VNWELL to the n-well region.

Figure 2:
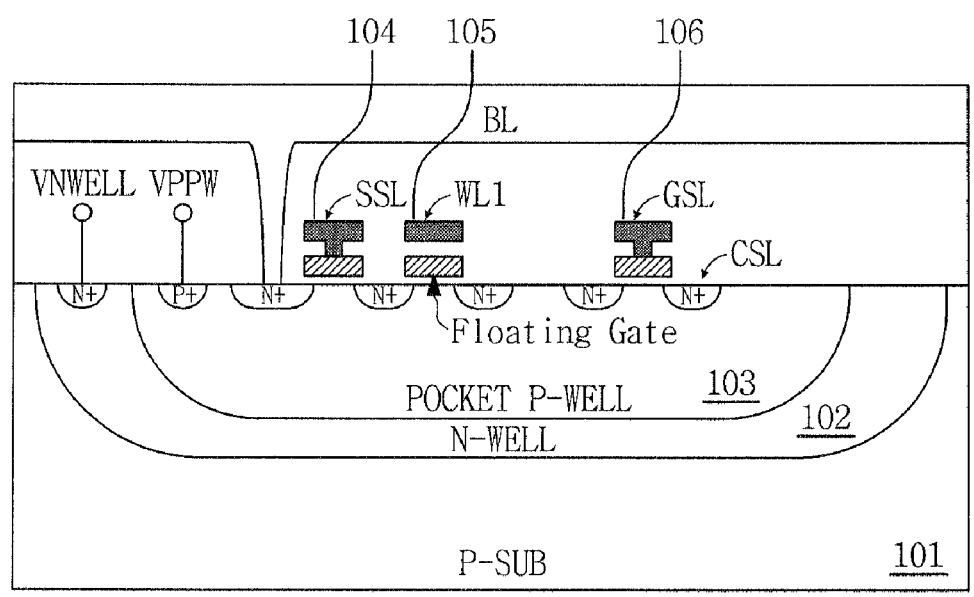
FIG. 2 is a cross-sectional view taken along section line I-I' of a memory cell array of the NAND-type flash memory device of FIG. 1, which shows the vertical structure of the memory cell array 160.

FIG. 2 is a cross-sectional view of the vertical structure of the memory cell array of the NAND-type flash memory device of FIG. 1, taken along section line I-I'.

Referring to FIG. 2, an n-well region 102 may be formed in a p-type substrate 101, and a pocket p-well region 103 may be formed in the n-well region 102. A floating gate transistor 105 used to store data has n-type source and drain regions. The string selection transistor 104, and a ground selection transistor 106 may be formed in the pocket p-well region 103. The control gate of the string selection transistor 104 is connected to the string selection line SSL. The control gate of the ground selection transistor 106 is connected to the ground selection line GSL. The control gate of the floating gate transistor 105 is connected to a first word line WL1.

As described above, the pocket p-well region 103 is biased at the pocket p-well bias voltage VPPW, and the n-well region 102 is biased at the n-well bias voltage VNWELL.

Figure 3:
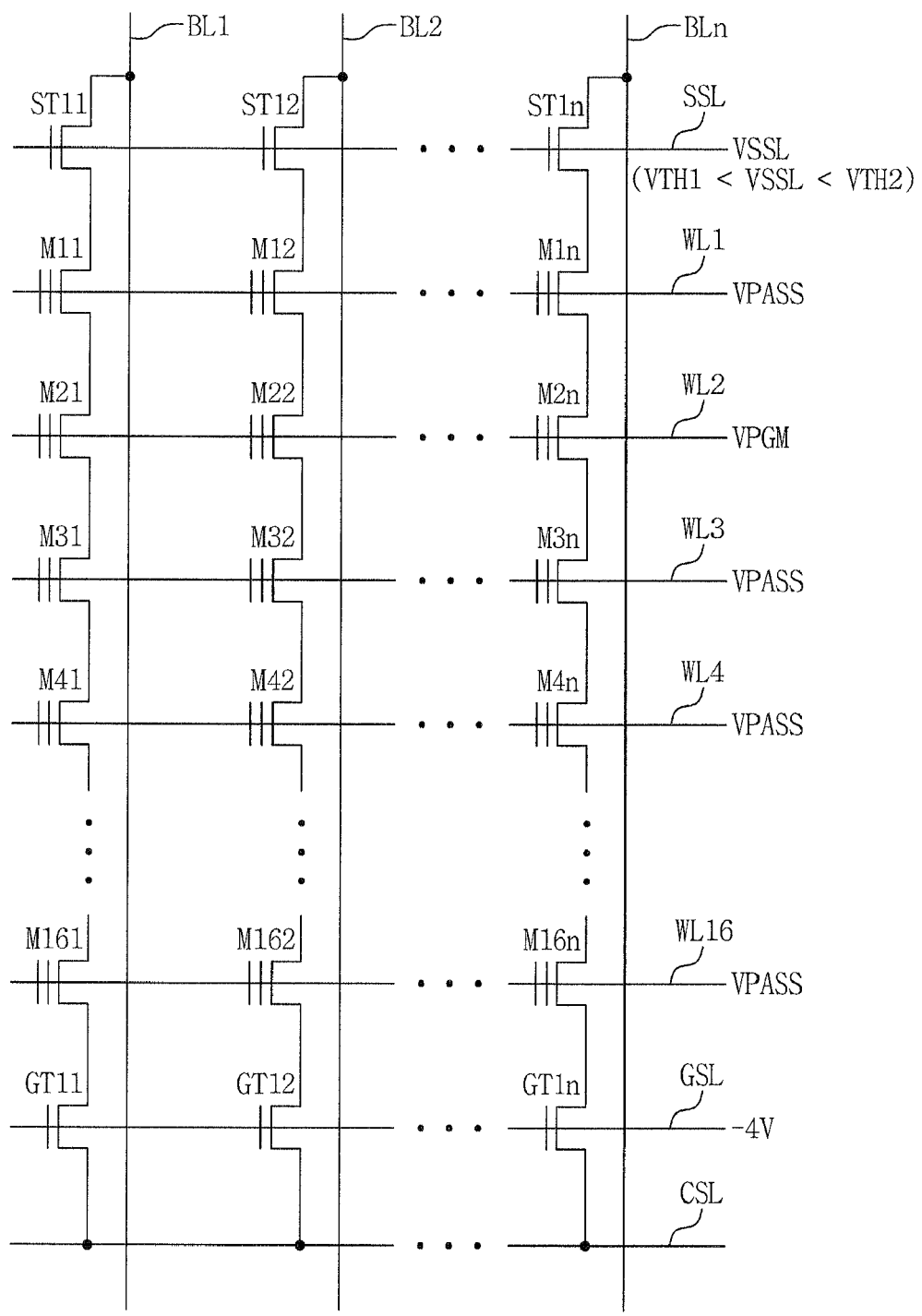
FIG. 3 is a circuit diagram of the memory cell array 160 of the NAND-type flash memory device of FIG. 1.

FIG. 3 is a circuit diagram of the memory cell array 160 of the NAND-type flash memory device of FIG. 1.

Referring to FIG. 3, the memory cell array 160 includes n string selection transistors ST[1][1] to ST[1][n], n ground selection transistors GT[1][1] to GT[1][n]. The memory cell array 160 further includes an array of n×16 memory cell (floating gate) transistors M[1][1] to M[16][n], which are coupled to bit lines BL1 to BLn, to the string selection line SSL (through the n string selection transistors ST), to the ground selection line GSL (through the n ground selection transistors GT). The control gates of the n×16 memory cell (floating gate) transistors M[1][1] to M[16][n] are connected to the plurality of word lines WL1 to WL16.

The program operation may be defined as the accumulation of electrons in a selected floating gate transistor, and an erase operation may be defined as the emission (release) of the electrons accumulated in the floating gate transistor into the channel thereof. In this case, the program operation may increases the threshold voltage VTH of the floating gate transistor based on data to be programmed. Thus, when the memory device is programmed as data "0" due to the accumulation of electrons, the threshold voltage VTH is increased, while when the memory device is programmed as data "1" due to the emission of electrons, the threshold voltage VTH is be maintained the same as when the memory device is erased.

In the memory cell array 160 of FIG. 3, in the program mode, a program voltage VPGM is applied to a selected word line WL2 coupled to a memory transistor M21 to be programmed, and a pass voltage VPASS is applied to unselected word lines W1 and WL3 to WL16. In the program mode, a first voltage VSSL having a voltage level higher than the threshold voltage VTH1 of the string selection transistor ST connected to the selected bit line may be applied to the string selection line SSL. And, the first voltage VSSL may be lower than the threshold voltage VTH2 of the unselected string selection transistor(s) ST.

Figure 4:
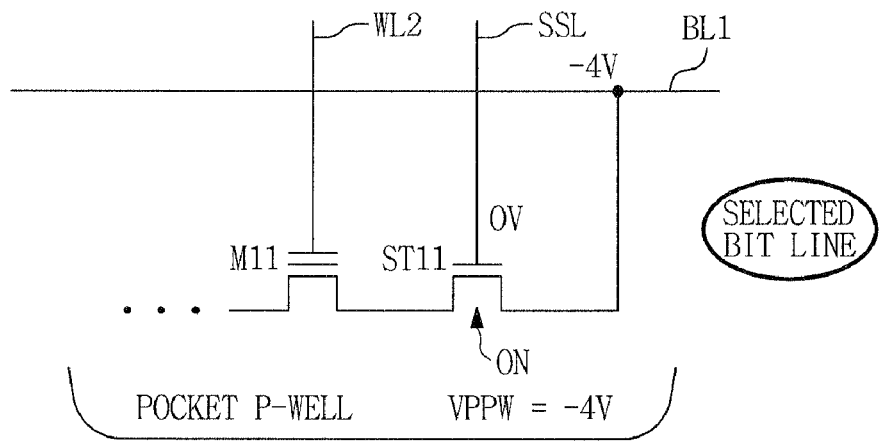
FIG. 4 is a circuit diagram of a string selection transistor coupled to a selected bit line of the memory cell array 160 of FIG. 3 and voltages applied to the selected bit line in a program mode.

FIG. 4 is a circuit diagram of a string selection transistor ST coupled to a selected bit line of the memory cell array of FIG. 3 and voltages applied to the selected bit line in a program mode.

Referring to FIG. 4, a selected bit line (e.g., BL1) 161 of the memory cell array is connected to a string selection transistor ST11, and a memory cell transistor M11 connected in series to the string selection transistor ST11, formed in a pocket p-well region 103. The control gate of the string selection transistor ST11 is connected to the string selection line SSL, and the control gate of the memory cell transistor M11 is connected to a word line (e.g., WL2). In FIG. 4, the effective threshold voltage of the string selection transistor ST11 connected to a selected bit line BL1 (at −4 volts) is VTH1.

In the program mode, a negative pocket p-well bias voltage VPPW is applied to the pocket p-well region 103, and a negative voltage is applied to the bit line BL1. The negative voltage applied to the bit line BL1 may be the same as the negative pocket p-well bias voltage VPPW. In the program mode, when a negative voltage is applied to the ground selection line GSL, the ground selection transistor GT11 remains turned OFF. When a voltage of about 0 V is applied to the string selection line SSL, a conductive channel is formed between the drain and the source of the string selection transistor ST11 so that the string selection transistor ST11 is turned ON. The memory cell transistor M11 is programmed in response to a program voltage VPGM (e.g., 9 V) applied to the word line WL2 because electrons are accumulated in the floating gate of the memory cell transistor M11 and thus increase its threshold voltage.

Figure 5:
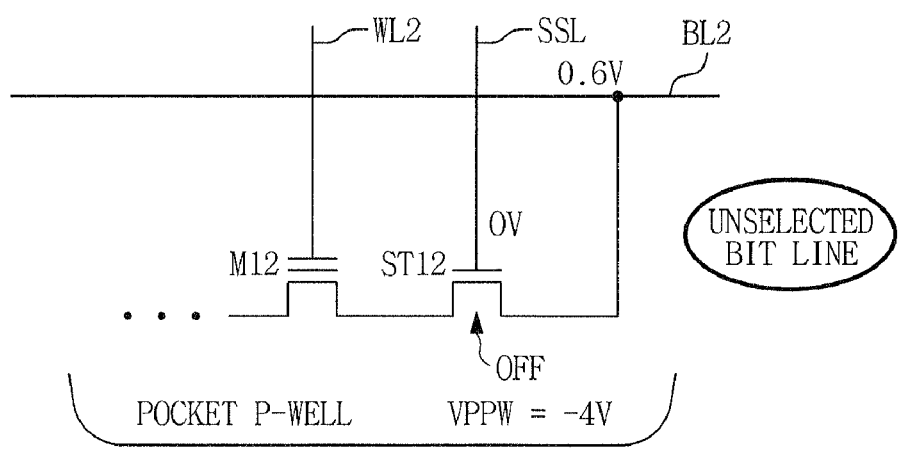
FIG. 5 is a circuit diagram of a string selection transistor coupled to an unselected bit line of the memory cell array 160 of FIG. 3 and voltages applied to the unselected bit line in the program mode.

FIG. 5 is a circuit diagram of a string selection transistor ST coupled to an unselected bit line of the memory cell array of FIG. 3 and voltages applied to the unselected bit line in the program mode.

Referring to FIG. 5, an unselected bit line 162 of the memory cell array includes a bit line BL2, a string selection transistor ST12 formed in a pocket p-well region 103, and a memory cell transistor M12 connected in series to the string selection transistor ST12. The control gate of the string selection transistor ST12 is connected to a string selection line SSL, and the control gate of the memory cell transistor M12 is connected to word line WL2. In FIG. 5, the effective threshold voltage of the string selection transistor ST12 connected to an unselected bit line BL2 (at 0.6 volts) is VTH2 which is higher than threshold voltage VTH1 of the string selection transistor ST11 connected to a selected bit line BL1 (at −4 volts) in FIG. 1. This difference is due to the "body effect".

The body effect describes the changes in the threshold voltage by the change in VSB, the source-bulk voltage. The source terminal of each string selection transistor is connected to a bitline, and thus the voltage applied on the bitline potentially affects the threshold voltage of each string selection transistor. Since the body influences the threshold voltage (when it is not tied to the source), it can be thought of as a second gate, and is sometimes referred to as the "back gate"; the body effect is sometimes called the "back-gate effect".

For an enhancement mode, n-mos MOSFET body effect upon threshold voltage is computed according to the Shichman-Hodges model using the following equation.

$$V_{TN} = V_{TO} + \gamma(\sqrt{V_{SB} + 2\phi_F} - \sqrt{2\phi_F})$$

where $V_{TN}$ is the threshold voltage when substrate bias is present, $V_{SB}$ is the source-to-body substrate bias, $2\phi_F$ is the surface potential, and $V_{TO}$ is threshold voltage for zero substrate bias, $\gamma=(t_{ox}/\epsilon_{ox})\sqrt{2q\epsilon_{si}N_A}$ is the body effect parameter, $t_{ox}$ is oxide thickness, $\epsilon_{ox}$ is oxide permittivity, $\epsilon_{si}$ is the permittivity of silicon, NA is a doping concentration, q is the charge of an electron.

In the program mode, a negative pocket p-well bias voltage VPPW is applied to the pocket p-well region 103, and an inhibition voltage may be applied to the unselected bit line BL2. The inhibition voltage may be such a voltage as to change the threshold voltage of the unselected string selection transistor so as not to form a channel, for example, a positive voltage. In FIG. 5, an inhibition voltage of, for example, about 0.6 V may be applied to the unselected bit line BL2. In the program mode, when a negative voltage is applied to a ground selection line GSL, a ground selection transistor GT12 remains turned OFF. Under this condition, when a voltage of about 0 V is applied to the string selection line SSL, a channel is not formed between the drain and the source of the string selection transistor ST12 so that the string selection transistor ST12 is turned OFF. Under this condition, even if a program voltage VPGM is applied to the word line WL2, the memory cell transistor M12 may not be programmed because electrons are not be accumulated in the floating gate of the memory cell transistor, and the threshold voltage may not be changed.

Figure 6:
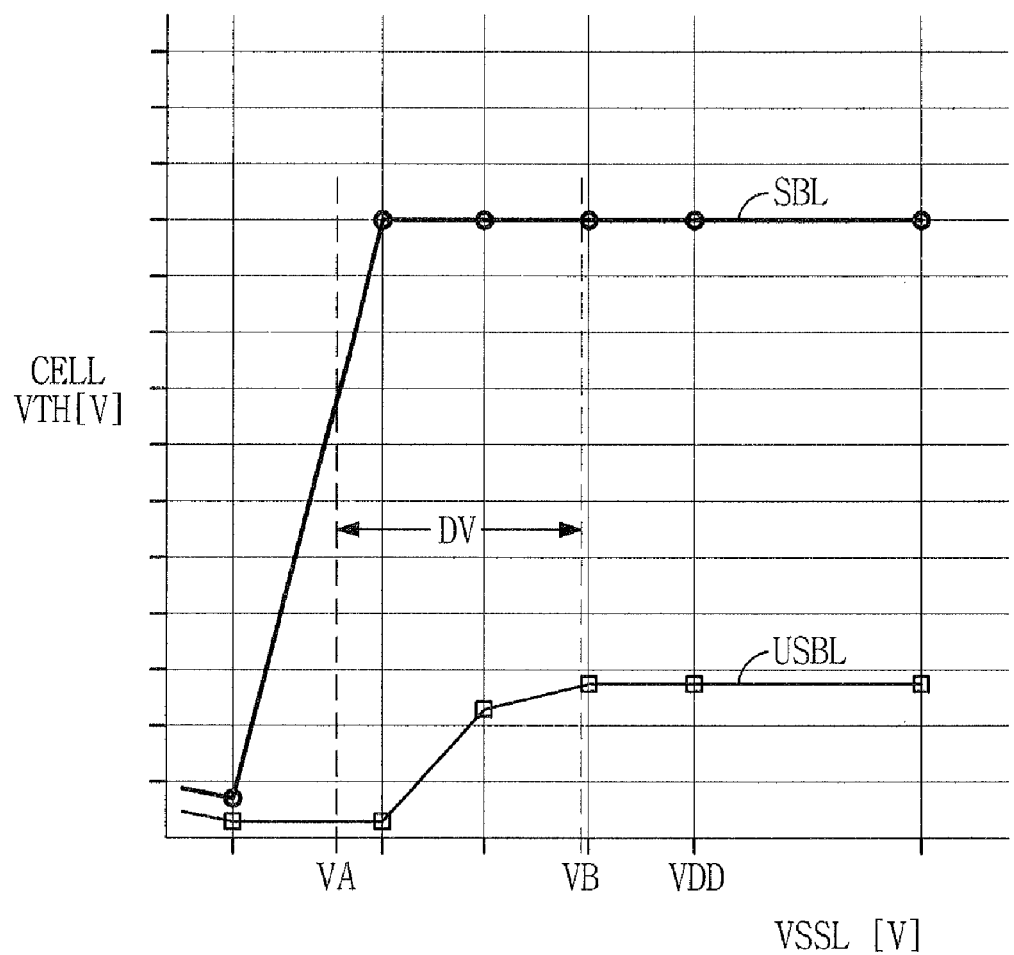
FIG. 6 is a graph of threshold voltages, showing variations of threshold voltages of memory cell transistors coupled to a selected bit line and an unselected bit line relative to a voltage applied to a string selection line.

FIG. 6 is a graph of threshold voltages, showing variations of threshold voltages of memory cell transistors coupled to a selected bit line BL and to an unselected bit line BL relative to a voltage applied to a string selection line SL.

In FIG. 6, the curve SBL denotes a variation in the threshold voltage of a memory cell transistor coupled to a selected bit line BL, and the curve USBL denotes a variation in the threshold voltage of a memory cell transistor coupled to an unselected bit line BL.

In FIG. 6, a time point at which the threshold voltage VTH is increased and saturated with an increase in a first voltage VSSL applied to the string selection line SSL may be the same as a time point at which the string selection transistor ST11 coupled to the selected bit line BL and the string selection transistor ST12 coupled to the unselected bit line BL are turned ON.

In the program mode, the memory cell transistor coupled to the selected bit line BL may need to be programmed, while the memory cell transistor coupled to the unselected bit line BL may need to be unprogrammed. Thus, in the program mode, the string selection transistor ST11 coupled to the selected bit line BL needs to be turned ON, while the string selection transistor ST12 coupled to the unselected bit line needs to be turned OFF.

Thus, referring to FIG. 6, the first voltage VSSL applied to the string selection line to turn ON the string selection transistor ST11 coupled to the selected bit line BL and turn OFF the string selection transistor ST12 coupled to the unselected bit line BL may be in the voltage range of DV(VB-VA).

Figure 7:
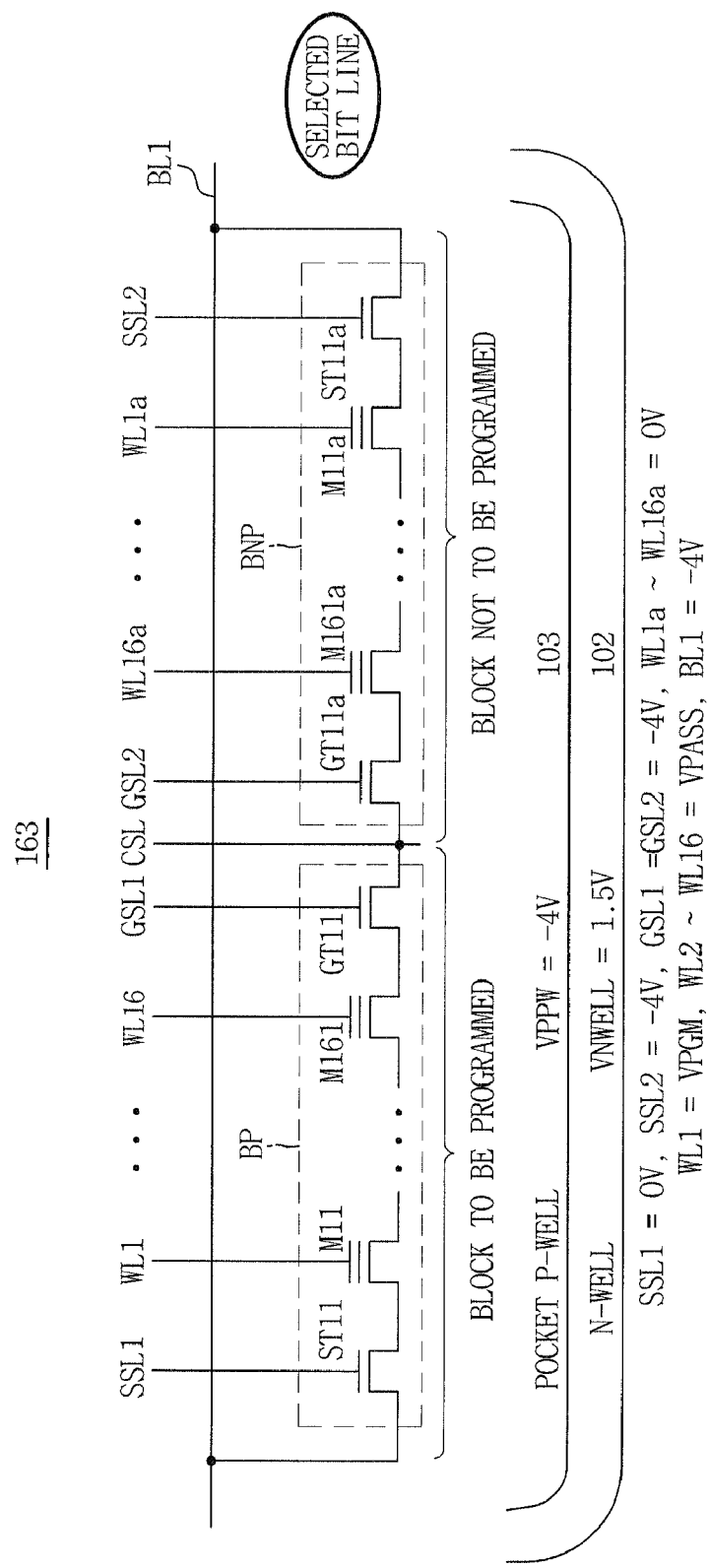
FIG. 7 is a circuit diagram of two strings in the memory cell array 160 of FIG. 3 sharing a selected bit line and voltages applied to the selected bit line in the program mode.

FIG. 7 is a circuit diagram of two strings in the memory cell array 160 of FIG. 3, and voltages applied to the selected bit line BL in the program mode. Referring to FIG. 7, a first (selected) string selection transistor SST11 of a selected block BP and a second (unselected) string selection transistor SST11a of an unselected block BNP are connected to the selected bit line BL1 of the memory cell array 160 of FIG. 3. FIG. 7 shows two memory blocks (BP and BNP) formed in one pocket p-well region 103, which may be formed in an n-well region 102, in the memory cell array 160.

Referring to FIGS. 1 and 7, the memory cell array 160 include a bit line BL1, and a first block BP (Block to be Programmed) and a second block BNP (Block Not to be Programmed), which may be coupled to each other in parallel between the bit line BL1 and a common source line CSL. The first block BP will be programmed, while the second block BNP will be left unprogrammed.

Referring to FIG. 7 the first block BP (Block to be Programmed) includes a (selected) string selection transistor ST11 and sixteen memory cell transistors M[1][1] to M[16][1] and a ground selection transistor GT11, which are connected in series to the (selected) string selection transistor ST11, all disposed in the pocket p-well region 103. The control gate of the selected string selection transistor ST11 is connected to string selection line SSL1, and the control gates of the sixteen memory cell transistors M11 to M161 are respectively connected to the sixteen word lines WL[1] to WL[16]. The gate of the ground selection transistor GT11 is connected to the ground selection line GSL1.

The second block BNP (Block Not to be Programmed) includes an (unselected) string selection transistor ST11a, and sixteen memory cell transistors M[1][1a] to M[16][1a] and a ground selection transistor GT11a connected in series to the unselected string selection transistor ST11a, all disposed in the pocket p-well region 103. The control gate of the string selection transistor ST11a is connected to string selection line SSL2, and the control gates of the sixteen memory cell transistors M11a to M161a are respectively connected to sixteen word lines WL1a to WL16a. The control gate of the ground selection transistor GT11a is connected to the ground selection line GSL2. Both the (selected) NAND-string comprising the (selected) string selection transistor ST11, and the (unselected) NAND-string comprising the (unselected) string selection transistor ST11a are commonly connected to a (selected) bit line BL1 while they are positioned in different memory blocks BP and BNP respectively.

In the program mode, a positive n-well bias voltage VNWELL (e.g., +1.5V) is applied to an n-well region 102, a negative pocket p-well bias voltage VPPW (e.g., -4V) is applied to the pocket p-well region 103, and a negative voltage (e.g., -4V) may be applied to the selected bit line BL1. In the program mode, when a negative voltage (e.g., -4V) is applied to ground selection lines GSL1 and GSL2, ground selection transistors GT11 and GT11a are turned OFF. Under this condition, when a first voltage (e.g., 0V) having a voltage level higher than the threshold voltage of the selected string selection transistor ST11 and lower than the threshold voltage of the unselected string selection transistor ST11a is applied to the string selection line SSL1 of the first block BP to be programmed, a channel is formed between the drain and the source of the string selection transistor ST11, and the string selection transistor ST11 is thus turned ON. Under this condition, the memory cell transistor M11 is programmed in response to the higher program voltage VPGM applied to the (selected) word line WL1. Thus, electrons are accumulated in the floating gate of the memory cell transistor M11 to increase its threshold voltage. The control gates of the memory cell transistors M12 to M161 to be left unprogrammed are not programmed due to a lower pass voltage VPASS being applied to the word lines WL2 to WL16. The pass voltage VPASS may be 1.5 V, for example.

At the same time, when a negative voltage, (for example, the same -4V voltage as the negative pocket p-well bias voltage VPPW), is applied to the string selection line SSL2 of the second block BNP to be left entirely unprogrammed, a channel is not formed between the drain and the source of the string selection transistor ST11a, and thus the string selection transistor ST11a remains turned OFF. Since a voltage of about 0 V (or ground voltage) is applied to the sixteen word lines WL1a to WL16a, all sixteen of the memory cell transistors M[1][1a] to M[16][1a] are not programmed. Thus, threshold voltages VTH of all sixteen of the memory cell transistors M11a to M161a are not changed (e.g., not increased).

Thus, in the program mode, since the selected string selection transistor ST11 on the selected bit line BL1 163 of the memory cell array is turned ON and the unselected string selection transistor ST11a is turned OFF, some or all of the memory cell transistors of the first block BP may be programmed, and all of the memory cell transistors of the second block BNP are left unprogrammed.

Figure 8:
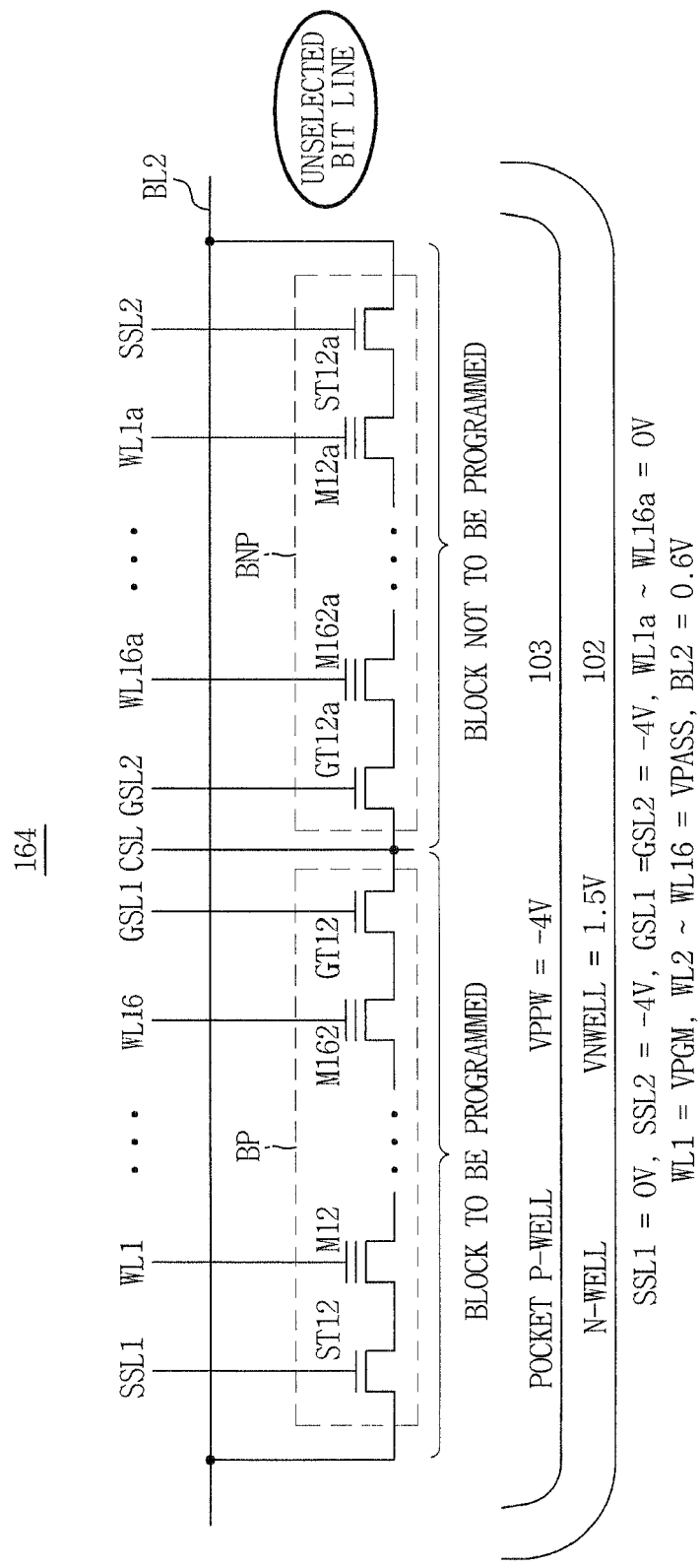
FIG. 8 is a circuit diagram of two strings in the memory cell array 160 of FIG. 3 sharing an unselected bit line and voltages applied to the unselected bit line in the program mode.

FIG. 8 is a circuit diagram of two strings in the memory cell array 160 of FIG. 3 a string selection transistor coupled to the unselected bit line of the memory cell array of FIG. 3 and voltages applied to the unselected bit line in the program mode. FIG. 8 shows two memory blocks in a single pocket p-well region 103, which may be formed in an n-well region 102 in the memory cell array 160 of FIG. 3.

Referring to FIG. 8, an unselected bit line 164 of the memory cell array includes a (unselected) bit line BL2, and a first block BP (Block to be Programmed) and a second block BNP (Block Not to be Programmed), which may be coupled to each other in parallel between the bit line BL2 and the common source line CSL. The first block BP will be programmed, and the second block BNP will be left unprogrammed.

The first block BP (Block to be Programmed) includes a string selection transistor ST[1][2] and sixteen memory cell transistors M[1][2] to M[16][2] and ground selection transistor GT[1][2], which are connected in series to the string selection transistor ST[1][2], all disposed in the pocket p-well region 103. The control gate of the string selection transistor ST[1][2a] is connected to a string selection line SSL1, and the control gates of the sixteen memory cell transistors M[1][2] to M[16][2] are be respectively connected to the sixteen word lines WL1 to WL16. The control gate of the ground selection transistor GT12 is connected to the ground selection line GSL1.

The second block BNP (Block Not to be Programmed) includes a string selection transistor ST12a, and sixteen memory cell transistors M12a to M162a and a ground selection transistor GT12a, which may be connected in series to the string selection transistor ST12a, all disposed in the pocket p-well region 103. The control gate of the string selection transistor ST12a is connected to the string selection line SSL2, and the control gates of the sixteen memory cell transistors M[1][2a] to M[16][2a] may be respectively connected to the sixteen word lines WL1a to WL16a. The control gate of ground selection transistor GT12a is connected to ground selection line GSL2.

The selected bit line BL1 163 of the memory cell array 160 shown in FIG. 7 and the unselected bit line BL2 164 of the memory cell array 160 shown in FIG. 8 may be formed in the one (same) pocket well region 103. Also, the first block BP includes the string selection transistor ST11 of FIG. 7 and the sixteen memory cell transistors M[1][1] to M[16][1] and the ground selection transistor GT11, which are connected in series to the string selection transistor ST11, together with the string selection transistor ST12 of FIG. 8, and the sixteen memory cell transistors M12 to M162 and the ground selection transistor GT12, which are connected in series to the string selection transistor ST12. Likewise, the second block BNP includes the string selection transistor ST11a of FIG. 7, the sixteen memory cell transistors M[1][1a] to M[16][1a] and the ground selection transistor GT11a, which are connected in series to the string selection transistor ST11a, together with the string selection transistor ST12a, and the sixteen memory cell transistors M[1][2a] to M[16][2a] and the ground selection transistor GT12a, which are connected in series to the string selection transistor ST12a.

In the program mode, a positive n-well bias voltage VNWELL is applied to the n-well region 102, a negative pocket p-well bias voltage VPPW is applied to the pocket p-well region 103, and a positive voltage may be applied to the bit line BL2 and, since a negative voltage of, for example, −4 V, is applied to the ground selection lines GSL1 and GSL2, the ground selection transistors GT11 and GT11a are turned OFF.

Under this condition, when a voltage of 0 V is applied to the selected string selection line SSL1 of the first block BP (Block to be programmed), unlike in the case of the selected bit line BL1 163, a channel is not be formed between the drain and the source of the string selection transistor ST12, and the string selection transistor ST12 remains turned OFF. Under this condition, even when a higher program voltage VPGM is applied to the (selected) word line WL1 connected to the gate of the memory cell transistor M[1][2] (and a lower pass voltage VPASS is applied to the word lines WL2 to WL16), the memory cell transistor M[1][2] is left unprogrammed.

Under this condition, when a voltage of about −4 V is applied to the string selection line SSL2 of the second block BNP to be left entirely unprogrammed, a channel is not formed between the drain and the source of the string selection transistor ST12a, and the string selection transistor ST12a remains turned OFF. Since a voltage of 0 V (or ground voltage) is applied to the sixteen word lines WL1a to WL16a, all sixteen of memory cell transistors M[1][2a] to M[16][2a] are left unprogrammed (not programmed). Thus, threshold voltages VTH of the sixteen memory cell transistors M[1][2a] to M[16][2a] is not changed (not increased).

Thus, in the program mode, while a positive voltage is applied to the bit line BL2, because the string selection transistors ST12 and ST12a of the unselected bit line of the memory cell array are turned OFF, and thus the memory cell transistors first and second blocks BP and BNP connected to bit line BL2 are not programmed.

Although FIGS. 7 and 8 illustrate an example of a memory cell array 160 having two memory blocks in one pocket well region 103, the memory cell array 106 may include an arbitrary number of memory blocks in an arbitrary number of pocket well regions 103.

Figure 9:
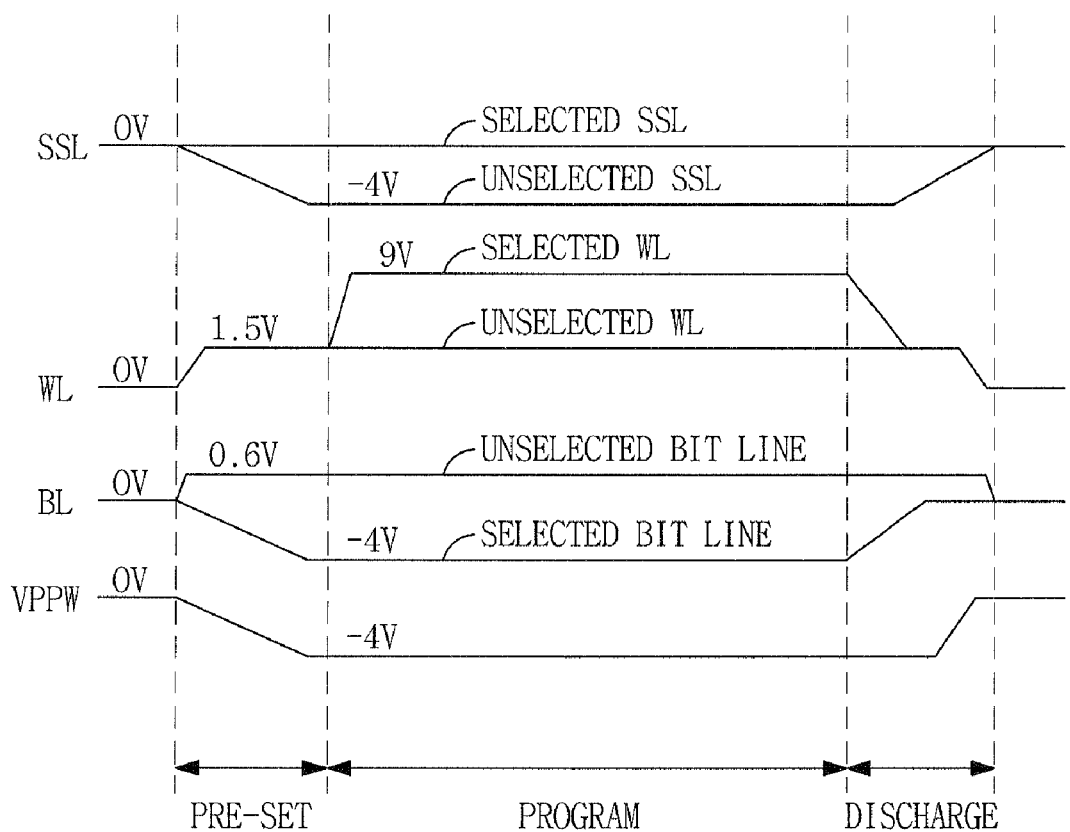
FIG. 9 is a timing diagram illustrating the program mode operation of the NAND-type flash memory device of FIG. 1.

FIG. 9 is a timing diagram illustrating the program mode operation of the NAND-type flash memory device of FIG. 1. The timing diagram of FIG. 9 shows a pre-set period, a program period, and a discharge period.

Referring to FIG. 9, in the program mode, for example: a voltage of 0 V is applied to a selected string selection line SSL, while a negative voltage of about −4 V is applied to an unselected string selection line SSL; and, for example, a positive voltage of about 9 V is applied to a selected word line WL, while a voltage of about 1.5 V is applied to an unselected word line WL; a negative voltage is applied to a selected bit line, while a positive voltage is applied to an unselected bit line; and a negative pocket p-well bias voltage VPPW is applied to a pocket p-well region 103.

Figure 10:
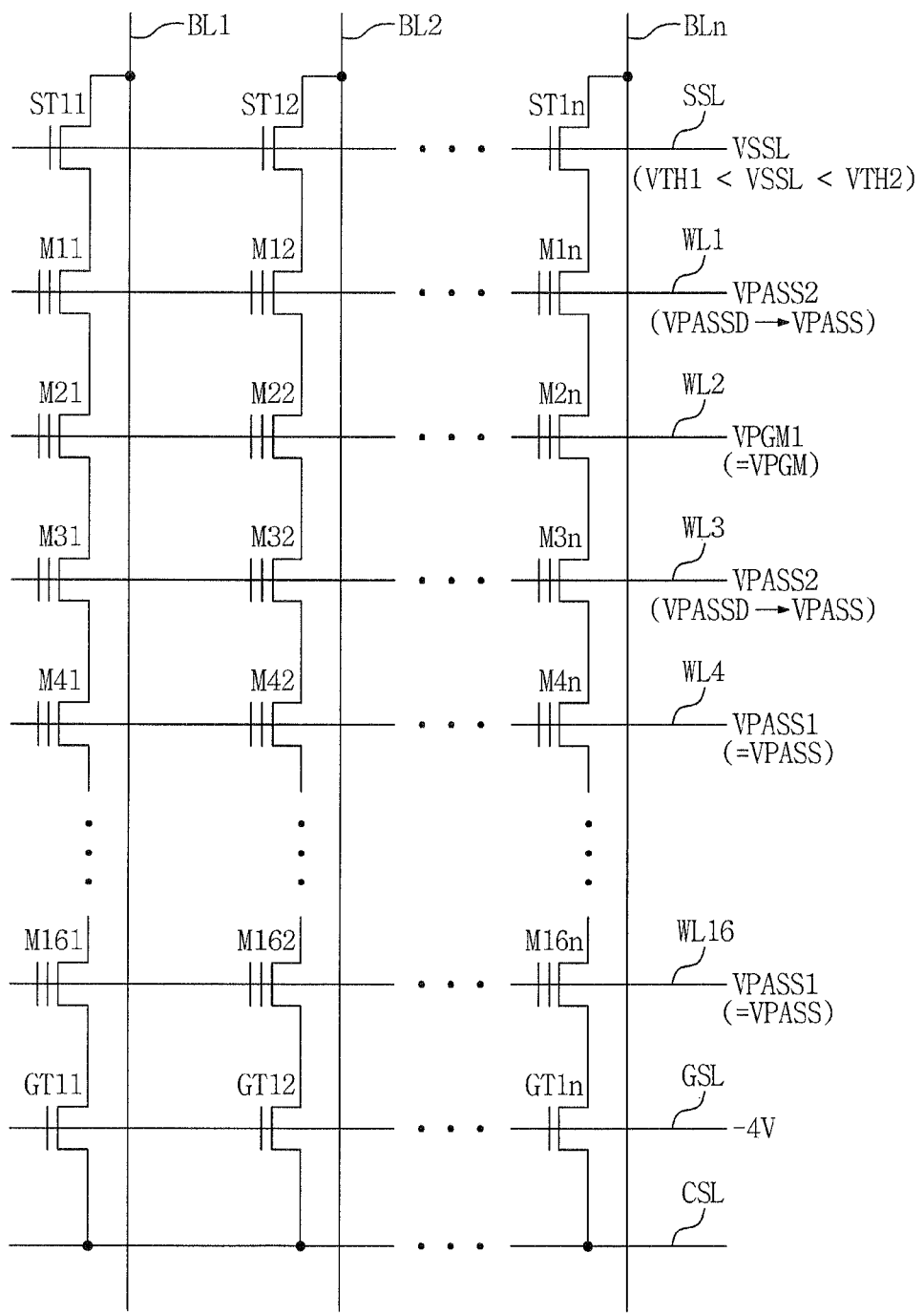
FIG. 10 is a circuit diagram of an alternative memory cell array 160a of the NAND-type flash memory device of FIG. 1, according to another embodiment of the inventive concept.
Figure 11:
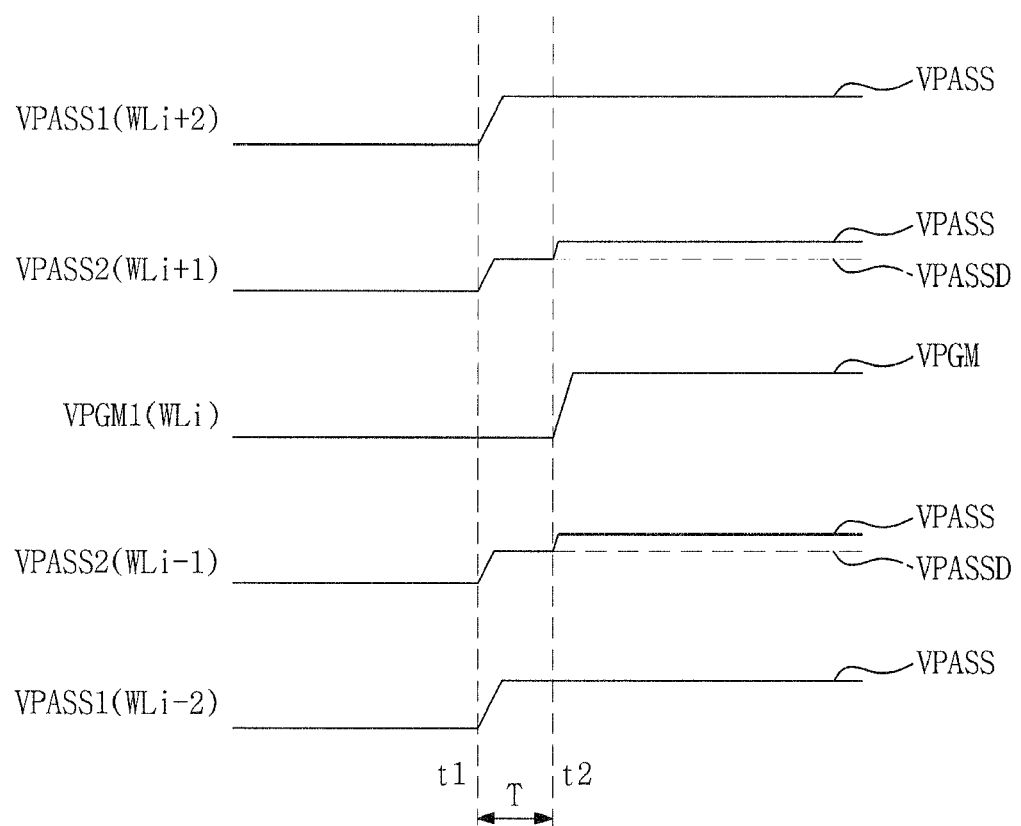
FIG. 11 is a timing diagram illustrating waveforms of voltages applied to the memory cell array 160a of FIG. 10 in a program mode.

FIG. 10 is a circuit diagram of alternative memory cell array 160a of the NAND-type flash memory device of FIG. 1, according to another exemplary embodiment of the inventive concept, and FIG. 11 is a timing diagram illustrating waveforms of voltages applied to the memory cell array 160a of FIG. 10 in a program mode.

Referring to FIG. 10, a memory cell array 160a includes n string selection transistors ST11 to ST1n, n ground selection transistors GT11 to GT1n, and n×16 memory transistors M[1][1] to M[16][n]. The memory transistors M[1][1] to M[16][n are coupled to the n bit lines BL1 to BLn, to a string selection line SSL, to a ground selection line GSL, and to word lines WL[1] to WL[16].

In the memory cell array 160a of FIG. 10, a program voltage VPGM is applied to the selected word line WL2 coupled to the memory transistor M[2][1] to be programmed, and a pass voltage VPASS is applied to the unselected word lines WL1 and WL3 to WL16. In the program mode, a first voltage VSSL having a voltage level higher than the threshold voltage VTH1 of a selected string selection transistor ST (and lower than the threshold voltage VTH2 of an unselected string selection transistor) may be applied to the string selection line SSL.

The memory cell array 160a of FIG. 10 may be a portion of a memory cell array, that corresponds to a memory block including memory transistors M11 to M16n coupled to 16 word lines WL1 to WL16 and to n bit lines BL1 to BLn.

In the program mode, a negative pocket p-well bias voltage VPPW is applied to the pocket p-well region 103, and a negative voltage is applied to the bit line BL1. In the program mode, since a negative voltage is applied to the ground selection line GSL, the ground selection transistor GT11 is turned OFF. Under this condition, when a voltage of 0 V is applied to the string selection line SSL, a channel is formed between the drain and the source of the string selection transistor ST11, and the string selection transistor ST11 is turned ON. Under this condition, the memory cell transistor M11 may be programmed in response to the program voltage VPGM applied to the word line WL1. Thus, electrons are accumulated in the floating gate of the memory cell transistor M11 to increase its threshold voltage.

Referring to FIG. 10, the memory cell array 160a includes n string selection transistors ST11 to ST1n and n ground selection transistors GT11 to GT1n and n×16 memory cell transistors M[1][1] to M[16][n]. The string selection transistor ST11, the memory cell transistors M1[1] to M16[1], and the ground selection transistor GT11 are coupled to the bit line BL1. The string selection transistor ST12, the memory cell transistors M12 to M162, and the ground selection transistor GT12 are coupled to the bit line BL2. The string selection transistor ST1n, the memory cell transistors M1n to M16n, and the ground selection transistor GT1n are coupled to the bit line BLn.

A first program voltage VPGM1 is applied to a selected word line WLi coupled to a selected memory cell transistor to be programmed. A second pass voltage VPASS2 is applied to the unselected word lines WLi+1 and WLi−1 directly neighboring (adjacent to) the selected word line WLi, and a first pass voltage VPASS1 is applied to unselected word lines WLi+2 and WLi−2 that are not directly adjacent to the selected word line WLi.

Referring to FIG. 11, the first program voltage VPGM1 is enabled at time point t2, and a first pass voltage VPASS1 is enabled at time point t1. A second pass voltage VPASS2 is changed to the voltage level of a down pass voltage VPASSD at time point t1 and changed to the voltage level of pass voltage VPASS at the time point t2 after a predetermined time T.

The NAND-type flash memory device including the memory cell array 160a of FIG. 10 applies a first voltage VSSL having a voltage level higher than the threshold voltage VTH1 of a selected string selection transistor (and lower than the threshold voltage VTH2 of an unselected string selection transistor) to a string selection line SSL in the program mode, thereby preventing the programming of a memory cell transistor coupled to an unselected bit line coupled to the same word line as a memory cell transistor to be programmed, which is coupled to a selected bit line.

Thus, the NAND-type flash memory device including the memory cell array of FIG. 10 may reduce programming disturbance between a cell string coupled to a selected bit line and a cell string coupled to an unselected bit line.

Also, the NAND-type flash memory device including the memory cell array 160a of FIG. 10 may initially apply a down pass voltage signal VPASSD to unselected word lines WL1 and WL3 adjacent to a selected word line WL2 and apply a pass voltage VPASS to the unselected word lines WL1 and WL3 after a predetermined time, thereby preventing the voltage applied to the unselected word lines WL1 and WL3 from becoming higher than the pass voltage VPASS due to a capacitive coupling effect. Thus, as shown in FIGS. 10 and 11, when voltages are applied to selected lines, bit lines, and word lines, the programming of memory cell transistors coupled to unselected word lines may be prevented.

Figure 12:
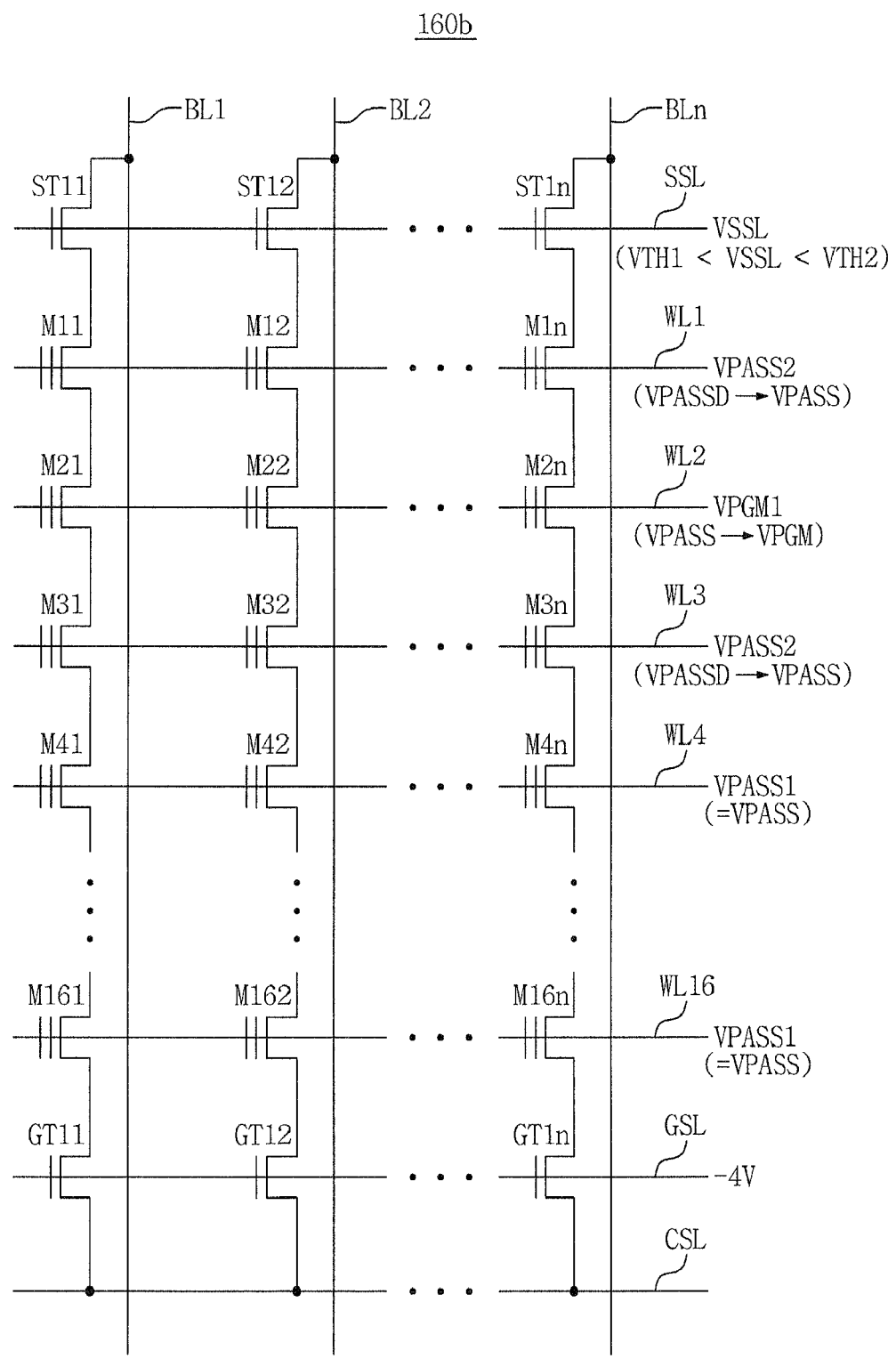
FIG. 12 is a circuit diagram of an alternative memory cell array 160b of the NAND-type flash memory device of FIG. 1, according to other embodiments of the inventive concept.
Figure 13:
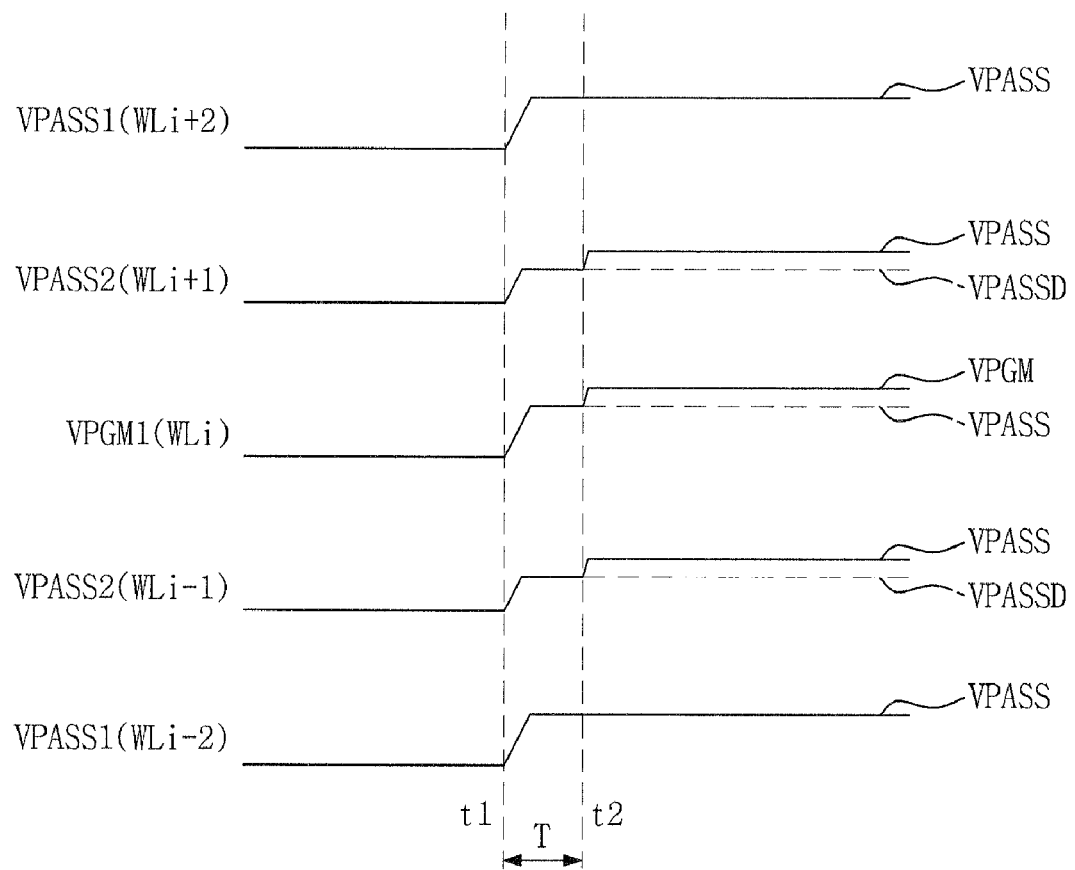
FIG. 13 is a timing diagram illustrating waveforms of voltages applied to the memory cell array of FIG. 12 in the program mode.

FIG. 12 is a circuit diagram of an alternative memory cell array 160b of the NAND-type flash memory device of FIG. 1, according to another exemplary embodiment of the inventive concept, and FIG. 13 is a timing diagram illustrating waveforms of voltages applied to the memory cell array 160b of FIG. 12 in the program mode.

Unlike the memory cell array 160a of FIG. 10, in the memory cell array 160b of FIG. 12, a voltage VPGM1 applied to a selected word line WL2 is initially changed to a level of the pass voltage VPASS and then changed to the level of a program voltage VPGM after a predetermined time has elapsed.

Referring to FIG. 13, a first program voltage VPGM1 is changed to the pass voltage (VPASS) level at time point t1 and then changed to the program voltage (VPGM) level at time point t2 after a predetermined time T, and a first pass voltage VPASS1 is enabled at the time point t1.

A second pass voltage VPASS2 is changed to the voltage level of a down pass voltage VPASSD at the time point t1 and after a predetermined time T is changed to the voltage level of a pass voltage VPASS at the time point t2.

The NAND-type flash memory device including the memory cell array 160b of FIG. 12 applies a first voltage VSSL having a voltage level higher than the threshold voltage VTH1 of a selected string selection transistor (and lower than the threshold voltage VTH2 of an unselected string selection transistor) to a string selection line SSL in the program mode, thereby preventing the programming of a memory cell transistor coupled to an unselected bit line coupled to the same word line as a memory cell transistor to be programmed, which is coupled to a selected bit line.

Thus, the NAND-type flash memory device including the memory cell array 160b of FIG. 12 may reduce programming disturbance between a cell string coupled to a selected bit line and a cell string coupled to an unselected bit line.

Also, the NAND-type flash memory device including the memory cell array 160b of FIG. 12 initially applies a down pass voltage VPASSD to unselected word lines WL1 and WL3 adjacent to a selected word line WL2, and applies a pass voltage VPASS after a predetermined time, and applies a first program voltage VPGM1 to the selected word line WL2. In this case, the selected word line WL2 is charged to a pass voltage (VPASS) level and charged to a program voltage (VPGM) level after a predetermined time T. As a result, voltages of the unselected word lines WL1 and WL3 are prevented from becoming higher than the pass voltage VPASS due to a capacitive coupling effect. Thus, as shown in FIGS. 12 and 13, when voltages are applied to selected lines, bit lines, and word lines, the programming of memory cell transistors coupled to unselected word lines may be prevented.

Figure 14:
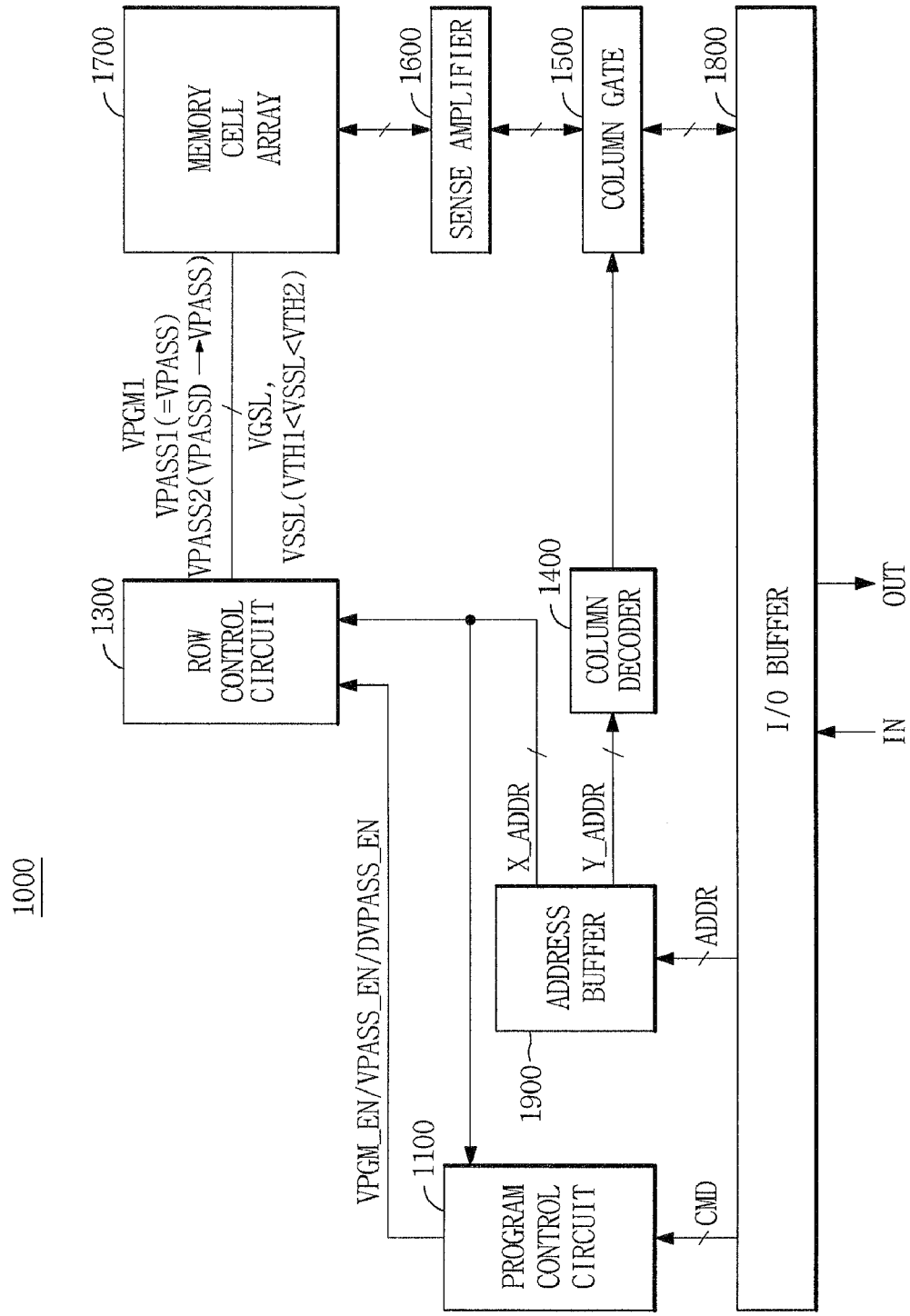
FIG. 14 is a block diagram of a NAND-type flash memory device according to other embodiments of the inventive concept.

FIG. 14 is a block diagram of a NAND-type flash memory device according to another exemplary embodiment of the inventive concept.

Referring to FIG. 14, a NAND-type flash memory device 1000 includes a program control circuit 1100, a row control circuit 1300, and a memory cell array 1700. (A high-voltage generating circuit 1200 generates a program voltage VPGM, a pass voltage VPASS, and a boost voltage VPP.) The program control circuit 1100 generates a program voltage enable signal VPGM_EN, a pass voltage enable signal VPASS_EN, and a down pass voltage enable signal DVPASS_EN in response to a command signal CMD and a row address signal X_ADDR. The row control circuit 1300 generates a first program voltage VPGM1, a first pass voltage VPASS1, a second pass voltage VPASS2, a string selection signal VSSL and a ground selection signal VGSL. The first pass voltage VPASS1 is changed to a voltage level of a pass voltage VPASS in response to a pass voltage enable signal VPASS_EN. The second pass voltage VPASS2 may have a voltage level of a down pass voltage VPASSD before the program voltage enable signal VPGM_EN is enabled, and have a voltage level of the pass voltage VPASS after the program enable signal VPGM_EN is enabled. The first program voltage VPGM1, the first pass voltage VPASS1, and the second voltage VPASS2 are transmitted to word lines coupled to the memory cell array 1700.

The NAND-type flash memory device 1000 further includes an address buffer 1900, a column decoder 1400, a column gate 1500, and a sense amplifier 1600.

The address buffer 1900 buffers an address ADDR and generates a row address X_ADDR and a column address Y_ADDR. The column decoder 1400 decodes the column address Y_ADDR and generates the decoded column address. The column gate 1500 gates externally received first data and gates externally output second data in response to the decoded column address. The sense amplifier 1600 amplifies output data of the memory cell array 1700, transmits the amplified data to the column gate 1500, receives output data of the column gate 1500, and transmits the received data to the memory cell array 1700.

The NAND-type flash memory device 1000 further includes an input/output (I/O) buffer 1800, which may externally receive a command CMD, an address ADDR, and data, buffer the received command CMD, address ADDR, and data, transmit the buffered command CMD, address ADDR, and data to an internal circuit, receive data from the internal circuit, buffer the received data, and externally output the buffered data.

The memory cell array 1700 included in the flash memory device 1000 of FIG. 14 may have the same structure as the memory cell array 160 of FIG. 3, or as the memory cell array 160a of FIG. 10 or as the memory cell array 160b of FIG. 12. The NAND-type flash memory device 1000 may prevent the programming of a memory cell transistor coupled to an unselected bit line coupled to the same word line as a memory cell transistor to be programmed, which is coupled to a selected bit line.

Thus, the NAND-type flash memory device 1000 of FIG. 14 may reduce programming disturbance between a cell string coupled to the selected bit line and a cell string coupled to the unselected bit line. Also, the NAND-type flash memory device 1000 may effectively prevent a voltage of an unselected word line directly adjacent to a selected word line from becoming higher than the voltage level of a pass voltage due to a capacitive coupling effect. As a result, the NAND-type flash memory device 100 may prevent the programming of the memory cell transistor coupled to the unselected word line.

Figure 15:
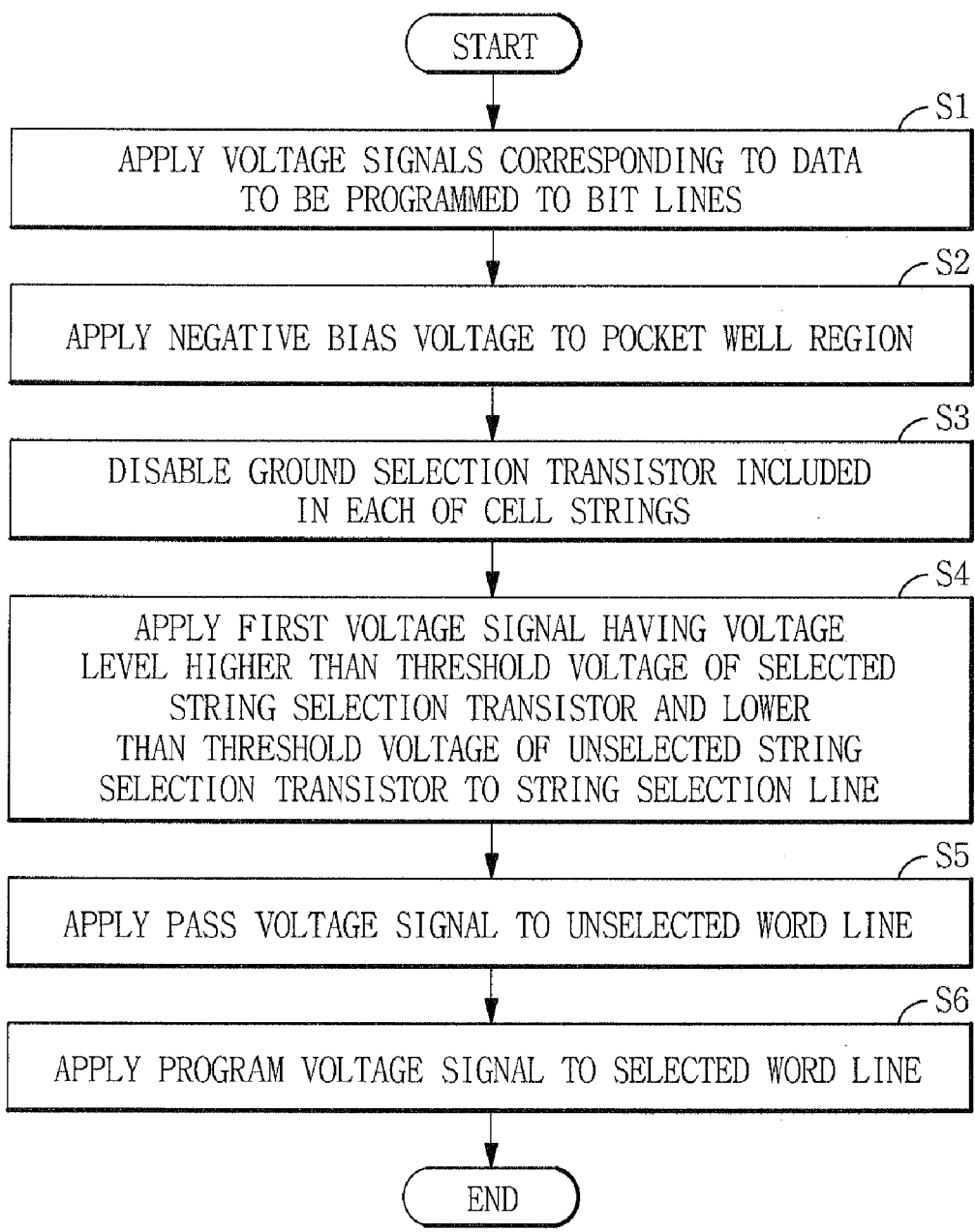
FIG. 15 is a flowchart illustrating a method of programming a NAND-type flash memory device according to embodiments of the inventive concept.

FIG. 15 is a flowchart illustrating a method of programming a NAND-type flash memory device according to another exemplary embodiment of the inventive concept.

The NAND-type flash memory device may include a memory cell array, which includes a plurality of cell strings. Each cell string includes a string selection transistor, a ground selection transistor having a first output terminal connected to a common source line, and a plurality of memory cell transistors connected in series between the string selection transistor and a second output terminal of the ground selection transistor. The cell strings are coupled to corresponding bit lines. Also, the memory cell array includes a plurality of word lines disposed in a direction perpendicular to the bit lines and parallel to one another.

Referring to FIG. 15, the method of programming the NAND-type flash memory device includes the following operations.

1) Apply Voltages corresponding to data to be programmed to bit lines (step S1).

2) Apply a negative bias voltage to a pocket well region (step S2).

3) Disable a ground selection transistor included in each of the cell strings (step S3). The method of disabling the ground selection transistor may be a floating method.

4) Apply a first voltage having a voltage level higher than the threshold voltage of a selected string selection transistor and lower than the threshold voltage of an unselected string selection transistor to a string selection line in a program mode (step S4).

5) Apply a pass voltage to an unselected word line (step S5).

6) Apply a program voltage to a selected word line (step S6).

Figure 16:
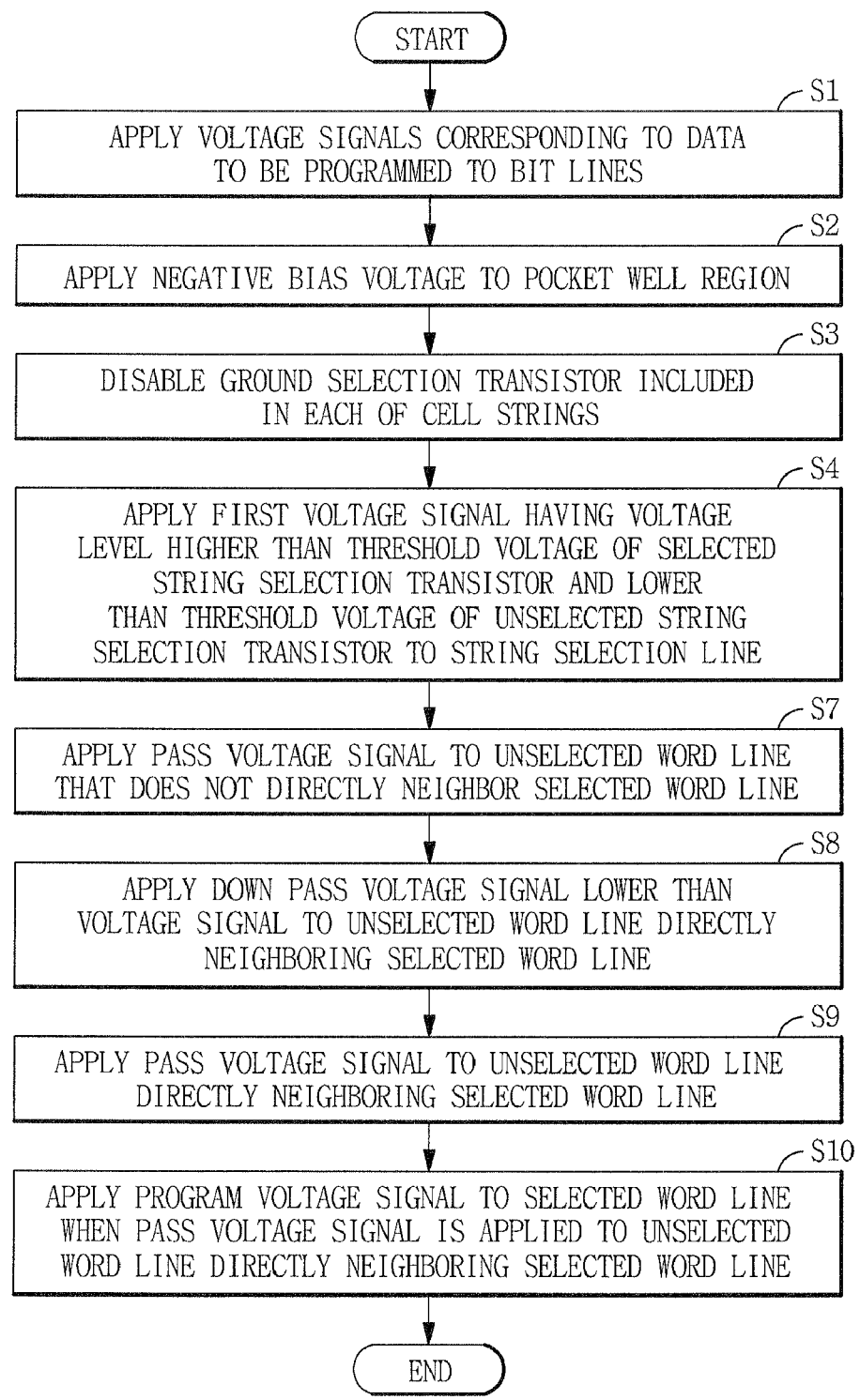
FIG. 16 is a flowchart illustrating a method of programming a NAND-type flash memory device according to other embodiments of the inventive concept.

FIG. 16 is a flowchart illustrating a method of programming a NAND-type flash memory device according to another exemplary embodiment of the inventive concept.

Referring to FIG. 16, the method of programming the NAND-type flash memory device includes the following steps.

1) Apply voltages corresponding to data to be programmed to bit lines (step S1).

2) Apply a negative bias voltage to a pocket well region (step S2).

3) Disable a ground selection transistor included in each of the cell strings (step S3). The method of disabling the ground selection transistor may be a floating method.

4) Apply a first voltage having a voltage level higher than the threshold voltage of a selected string selection transistor and lower than the threshold voltage of an unselected string selection transistor to a string selection line in a program mode (step S4).

5) Apply a pass voltage to an unselected word line not directly adjacent to a selected word line (step S7).

6) Apply a down pass voltage lower than the pass voltage to the unselected word line adjacent to the selected word line (step S8).

7) Apply the pass voltage to the unselected word line directly adjacent to the selected word line (step S9).

8) When the pass voltage is applied to the unselected word line(s) directly adjacent to the selected word line, a program voltage is applied to the selected word line (step S10).

FIG. 17 is a flowchart illustrating a method of programming a NAND-type flash memory device according to another exemplary embodiment of the inventive concept.

Referring to FIG. 17, the method of programming the NAND-type flash memory device may include the following operations.

1) Apply voltages corresponding to data to be programmed to bit lines (step S1).

2) Apply a negative bias voltage to a pocket well region (step S2).

3) Disable a ground selection transistor included in each of cell strings (step S3).

The method of disabling the ground selection transistor may be a floating method.

4) Apply a first voltage having a voltage level higher than the threshold voltage of a selected string selection transistor and lower than the threshold voltage of an unselected string selection transistor to a string selection line in a program mode (step S4).

5) Apply a pass voltage to an unselected word line that is not directly adjacent to a selected word line (step S7).

6) Apply a down pass voltage lower than the pass voltage to the unselected word line directly adjacent to the selected word line (step S8).

7) When the down pass voltage is applied to the unselected word line directly adjacent to the selected word line, apply the pass voltage to the selected word line (step S11).

8) Apply the pass voltage to the unselected word line directly adjacent to the selected word line (step S9).

9) When the pass voltage is applied to the unselected word line directly neighboring the selected word line, apply a program voltage to the selected word line (step S10).

Although a NAND-type flash memory device having a negative bias voltage is described above, the present inventive concept is also applicable to other nonvolatile semiconductor memory devices, such as a phase-change random access memory (PRAM) having a negative bias voltage.

The present inventive concept may be applied to a nonvolatile memory device and a memory system including the same, particularly, a NAND-type flash memory device and a memory system including the same.

A method of programming a nonvolatile semiconductor memory device according to an embodiment of the inventive concept may reduce a programming disturbance between a selected cell string and an unselected cell string in a nonvolatile semiconductor memory device using a negative bias voltage. Also, the method of programming the nonvolatile semiconductor memory device may prevent the programming of unselected memory cell transistors connected to a word line neighboring a word line connected to a memory cell transistor to be programmed.

The foregoing is illustrative of exemplary embodiments and is not to be construed as limiting the inventive concept. Although a few embodiments have been described, those skilled in the art will readily appreciate that many modifications are possible in embodiments without materially departing from the inventive concept herein. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of programming a nonvolatile semiconductor memory device having a NAND-type memory cell array disposed in a pocket well, the method comprising:
applying a negative bias voltage to the pocket well; and
applying a first voltage to the gates of string selection transistors of strings in a memory block formed in the pocket well,
wherein the first voltage is higher than the threshold voltage of a string selection transistor of each string connected to a selected bit line and lower than the threshold voltage of each string selection transistor of a string connected to an unselected bit line.

2. The method of claim 1, wherein a negative voltage is applied to the selected bit line, and a program inhibition voltage is applied to the unselected bit line.

3. The method of claim 2, wherein the program inhibition voltage is higher than the negative bias voltage applied to the pocket well and is higher than the first voltage.

4. The method of claim 2, wherein the program inhibition voltage is higher than 0 V.

5. The method of claim 2, wherein a voltage having the same voltage level as the negative bias voltage applied to the pocket well is applied to the selected bit line.

6. A method of programming a nonvolatile semiconductor memory device, the method comprising:
applying a negative voltage as a bias voltage to a pocket well in which a first memory block and a second memory block sharing the same bit lines are formed;
in a program mode, applying a first voltage to the gates of string selection transistors within the first memory block wherein the first voltage is higher than the threshold voltage of each string selection transistor in the first memory block connected to a selected bit line and wherein the first voltage is lower than the threshold voltage of each string selection transistor in the first memory block connected to an unselected bit line.

7. The method of claim 6, further comprising applying a negative voltage having the same voltage level as a bias voltage of the pocket well to the gates of string selection transistors in the second memory block in the program mode.

8. The method of claim 6, wherein each bit line of the second memory block shares a metal line with the first memory block and contacts the string selection transistors of the second memory block separate from the string selection transistors of the first memory block.

9. The method of claim 6, wherein the first voltage is applied to the gates of the string selection transistors in the first memory block, and a second voltage having the same voltage level as the negative bias voltage applied to the pocket well is applied to the gates of the string selection transistors in the second memory block.

10. The method of claim 9, wherein the gates of the string selection transistors in the first memory block are connected to a first string selection line, and the gates of the string selection transistors in the second memory block are connected to a second string selection line electrically disconnected from the first string selection line.

11. A method of programming a nonvolatile semiconductor memory device having a NAND-type array including a memory block formed in a pocket well, the method comprising:
applying voltages corresponding to data to be programmed to bit lines of the memory block;
turning ON the string selection transistors in each of the cell strings of the memory block connected to selected bit lines and turning OFF the string selection transistors in each of the cell strings of the memory block connected to unselected bit lines.

12. The method of claim 11, further comprising disabling the ground selection transistors in each of the cell strings of the memory block.

13. The method of claim 11, wherein the turning ON and turning OFF of string selection transistors in the cell strings of the memory block includes:
applying a first bitline voltage to selected bit lines of the memory block and applying a second bitline voltage to unselected bit lines of the memory block, wherein the second bitline voltage is higher than the first bitline voltage;
applying a negative bias voltage to the pocket well;
applying a first voltage to the gates of string selection transistors in each of the cell strings of the memory block,
wherein the first voltage is higher than the threshold voltage of each string selection transistor of a cell string of the memory block connected to a selected bit line and lower than the threshold voltage of each string selection transistor of a cell string of the memory block connected to an unselected bit line.

14. The method of claim 13, wherein a voltage having the same voltage level as the negative bias voltage applied to the pocket well is applied to the selected bit line.

15. The method of claim 11, wherein a negative voltage is applied to the selected bit line, and a program inhibition voltage is applied to the unselected bit line.

16. The method of claim 15, wherein the program inhibition voltage is higher than 0 V.

17. The method of claim 15, wherein the program inhibition voltage is higher than the negative bias voltage applied to the pocket well and is higher than the first voltage.

18. The method of claim 11, wherein the gates of the string selection transistors in each of the cell strings of the first memory block are connected to a common voltage, and an independent bias is applied to the bit line connected to each of the string selection transistors.

* * * * *